(12) United States Patent
Schiaffino et al.

(10) Patent No.: US 7,842,963 B2
(45) Date of Patent: Nov. 30, 2010

(54) ELECTRICAL CONTACTS FOR A SEMICONDUCTOR LIGHT EMITTING APPARATUS

(75) Inventors: Stefano Schiaffino, Pleasanton, CA (US); John Julian Uebbing, Palo Alto, CA (US)

(73) Assignees: Koninklijke Philips Electronics N.V., Eindhoven (NL); Philips Lumileds Lighting Company, LLC, San Jose, CA (US)

( * ) Notice: Subject to any disclaimer, the term of this patent is extended or adjusted under 35 U.S.C. 154(b) by 805 days.

(21) Appl. No.: 11/550,488

(22) Filed: Oct. 18, 2006

(65) Prior Publication Data

US 2008/0096297 A1 Apr. 24, 2008

(51) Int. Cl.
*H01L 33/62* (2010.01)
(52) U.S. Cl. .................. 257/99; 257/E33.065; 438/42
(58) Field of Classification Search .................. 257/99, 257/E33.065; 438/42
See application file for complete search history.

(56) References Cited

U.S. PATENT DOCUMENTS 6,828,596 B2 12/2004 Steigerwald et al.
7,259,447 B2 * 8/2007 Kong et al. .................. 257/676
2005/0056855 A1 3/2005 Lin et al.
2005/0156177 A1 * 7/2005 Lin et al. ...................... 257/79
2006/0043392 A1 3/2006 Kurahashi et al.
2006/0192223 A1 8/2006 Lee et al.

FOREIGN PATENT DOCUMENTS

GB 2343994 A 5/2000

OTHER PUBLICATIONS

International Search Report and Written Opinion, 11 pages.

* cited by examiner

*Primary Examiner*—Steven J Fulk (57) ABSTRACT

A process for forming electrical contacts for a semiconductor light emitting apparatus is disclosed. The light emitting apparatus has a first layer of first conductivity type, an active layer for generating light overlying the first layer, and a second layer of second conductivity type overlying the active layer. The process involves forming at least a first and a second elongate electrical contact through the second layer and the active layer to provide electrical connection to the first layer, the first and second contacts oriented at an angle to each other, the first contact having a first end in proximity with the second contact, the first end being sufficiently spaced apart from the second contact such that when current is supplied to the first layer through the contacts, current contributions from the first end of the first contact and the second contact in an area generally between the first end and the second contact cause a current density in the area that is approximately equal to a current density elsewhere along the first and second contacts.

23 Claims, 7 Drawing Sheets

ELECTRICAL CONTACTS FOR A SEMICONDUCTOR LIGHT EMITTING APPARATUS

BACKGROUND OF THE INVENTION

1. Field of Invention

This invention relates generally to semiconductor light-emitting devices, and more specifically to electrical contacts for semiconductor light-emitting devices.

2. Description of Related Art

Semiconductor light-emitting devices such as light-emitting diodes (LEDs) provide efficient sources of light and are more robust than incandescent light bulbs and fluorescent tubes. Advancements in LED technology and processing have facilitated the use of such devices as replacements for traditional lighting sources in commercial and residential lighting applications, for example. Efficiency and reliability are thus important aspects of LEDs used in lighting applications. Additionally demands for increased light output from LEDs are growing resulting in higher operating currents.

It is common to fabricate LEDs with both n-type and p-type contacts on the same side of the semiconductor die, such that light may be emitted from a light output surface unimpeded by electrical contacts. In such cases electrical contact to at least one of the layers may extend through the other layers of the die, thus reducing the light generating area within the LED. Semiconductor materials used for n-type and p-type regions of semiconductor LEDs generally have low carrier mobility. Consequently a plurality of contacts are commonly used to supply current to an inner semiconductor layer of the LED such that the current spreads out across the layer, thus causing substantially uniform generation of light in the LED. However, employing a plurality of contacts may reduce the light generating area of the LED and thus in general, electrical contact design in LEDs involves a trade-off between current spreading and usable light generating area remaining once the contacts have been formed.

There remains a need for improved processes for forming electrical contacts for semiconductor LEDs.

SUMMARY OF THE INVENTION

In accordance with one aspect of the invention there is provided a process for forming electrical contacts for a semiconductor light emitting apparatus. The light emitting apparatus has a first layer of first conductivity type, an active layer for generating light overlying the first layer, and a second layer of second conductivity type overlying the active layer. The process involves forming at least a first and a second elongate electrical contact through the second layer and the active layer to provide electrical connection to the first layer, the first and second contacts oriented at an angle to each other, the first contact having a first end in proximity with the second contact, the first end being sufficiently spaced apart from the second contact such that when current is supplied to the first layer through the contacts, current contributions from the first end of the first contact and the second contact in an area generally between the first end and the second contact cause a current density in the area that is approximately equal to a current density elsewhere along the first and second contacts Forming may involve forming the first and second contacts such that the first end of the first contact is proximate a first end of the second contact.

The semiconductor light emitting apparatus may include a generally rectangular semiconductor structure and forming may involve forming the contacts along adjacent peripheral edges of the semiconductor structure such that the first end of the first contact and the first end of the second contact are proximate a first corner of the semiconductor structure.

Forming may involve forming electrical contacts along each of the peripheral edges of the rectangular semiconductor structure such that adjacent pairs of the contacts have spaced apart ends proximate respective corners of the generally rectangular semiconductor structure such that when current is supplied to the first layer through the contacts, current contributions from the respective spaced apart ends in an area generally between the spaced apart ends cause a current density in the area that is approximately equal to a current density elsewhere along the contacts.

The process may involve forming at least one aperture through the second layer and the active layer and forming an electrical via contact to the first layer through the aperture, the aperture being spaced inwardly from the peripheral edges of the semiconductor structure.

The process may involve interconnecting the electrical via contact and at least the first and the second contacts to form a first electrode for supplying current to the first layer.

Forming may involve forming a channel having sidewalls and a bottom wall, the sidewalls extending through the second layer and the active layer, the bottom wall comprising a portion of the first layer. The process may further involve insulating the sidewalls to prevent electrical contact to the second layer and the active layer by the first and second contacts. The process may further involve depositing an electrically conductive material in the channel, in electrical contact with the first layer such that the first end of the first contact is spaced apart from the second contact.

Depositing may involve patterning the electrically conductive material to remove conductive material from at least the first end of the first contact to cause the first end of the first contact to be spaced apart from the second contact.

Insulating may involve depositing a dielectric material proximate the first end of the first contact, the dielectric material being operable to insulate the first end from the second contact when depositing the electrically conductive material in the channel.

Insulating may involve depositing a dielectric material on the sidewalls.

The process may involve interconnecting at least the first and the second contacts.

Interconnecting may involve forming an interconnecting layer between the elongate electrical contacts, the interconnecting layer overlying at least a portion of the second layer and being insulated therefrom.

Forming may involve forming the electrical contacts by removing portions of the second layer and the active layer.

In accordance with another aspect of the invention there is provided a semiconductor structure for use in a semiconductor light emitting apparatus. The structure includes a first layer having a first conductivity type, an active layer for generating light, the active layer overlying the first layer, and a second layer having a second conductivity type, the second layer overlying the active layer. The structure also includes at least a first and a second elongate electrical contact extending through the second layer and the active layer and in electrical contact with the first layer, the first and second contacts being oriented at an angle to each other, the first contact having a first end proximate the second contact, the first end being sufficiently spaced apart from the second contact such that when current is supplied to the first layer through the contacts, current contributions from the first end of the first contact and the second contact in an area generally between the first end and the second contact cause a current density in the area that is approximately equal to a current density elsewhere along the first and second contacts.

The first end of the first contact may be proximate a first end of the second contact.

The semiconductor light emitting structure may include a generally rectangular semiconductor structure and the first contact may extend along a first peripheral edge of the semiconductor structure and the second contact may extend along a second adjacent peripheral edge of the semiconductor structure such that the first end of the first contact and the first end of the second contact are proximate a first corner of the semiconductor structure.

The structure may include a third elongate electrical contact extending along a third peripheral edge of the semiconductor structure and a fourth elongate electrical contact extending along a fourth peripheral edge of the semiconductor structure such that adjacent pairs of the first, second, third, and fourth contacts have spaced apart ends proximate respective corners of the generally rectangular semiconductor structure such that when current is supplied to the first layer through the contacts, current contributions from the respective spaced apart ends in an area generally between the spaced apart ends cause a current density in the area that is approximately equal to a current density elsewhere along the contacts.

The structure may include at least one aperture extending through the second layer and the active layer, the aperture being spaced inwardly from the peripheral edges of the semiconductor structure and an electrical via contact extending through the aperture and in electrical contact with the first layer.

The structure may include an interconnect between the electrical via contact and at least the first and the second contacts, the interconnect being operable to facilitate supplying current to the first layer.

Each elongate electrical contact may include a channel having sidewalls and a bottom wall, the sidewalls extending through the second layer and the active layer, the bottom wall comprising a portion of the first layer, an electrically conductive material in the channel and in electrical contact with the first layer, and a dielectric material between the electrically conductive material and the sidewalls, the dielectric material being operable to prevent electrical contact to the second layer and the active layer by the first and second contacts.

The structure may include an interconnect between at least the first and the second contacts, the interconnect being operable to facilitate supplying current to the first layer.

The interconnect may include interconnect portions overlying at least a first portion of the second layer, the interconnect portions being insulated from the second layer.

The first layer may include an n-type semiconductor material and the second layer may include a p-type semiconductor material.

In accordance with another aspect of the invention there is provided a semiconductor light emitting apparatus including the semiconductor structure above and further including a first electrode in electrical contact with at least the first and the second electrical contacts and a second electrode in electrical contact with the second layer and whereby light is generated in the active layer when a voltage is applied between the first electrode and the second electrode such that a forward bias current flows through the active layer.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

In drawings which illustrate embodiments of the invention.

DETAILED DESCRIPTION

Figure 1:
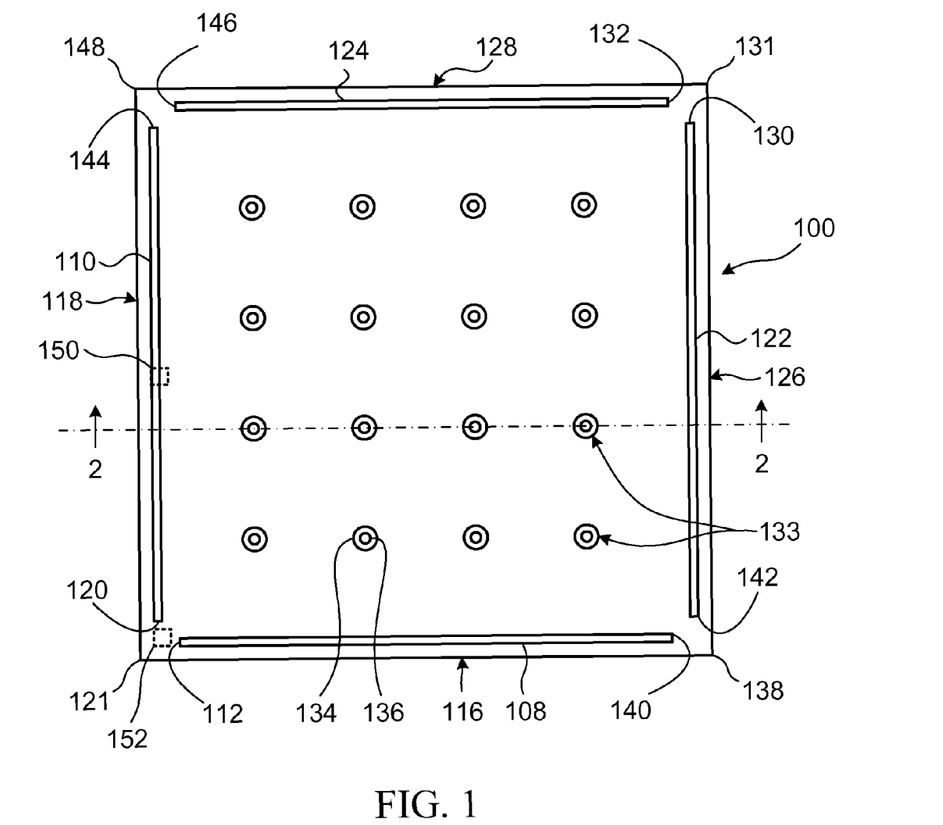
FIG. 1 is a schematic plan view of a semiconductor structure in accordance with a first embodiment of the invention.
Figure 2:
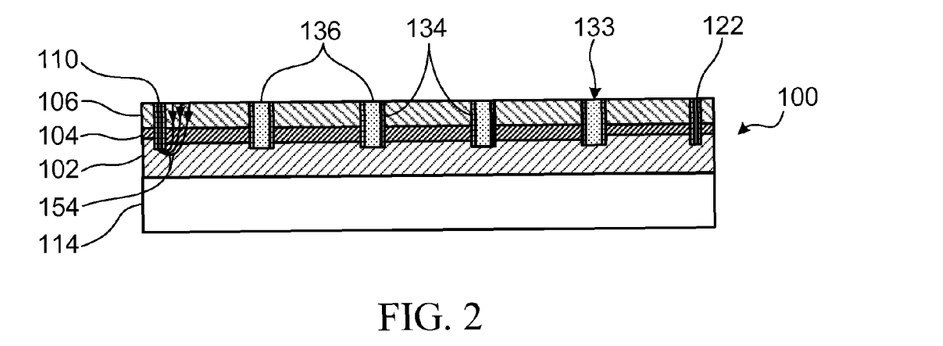
FIG. 2 is a schematic cross sectional view of the semiconductor structure shown in FIG. 1.

Referring to FIG. 1 and FIG. 2, a semiconductor structure for use in a semiconductor light emitting apparatus is shown generally at 100. The structure 100 includes a first layer 102 of first conductivity type and an active layer 104 overlying the first layer 102. The active layer 104 is operable to generate light. The structure 100 also includes a second layer 106 of second conductivity type, overlying the active layer 104.

The structure 100 further includes at least a first elongate electrical contact 108 and a second elongate electrical contact 110 extending through the second layer 106 and the active layer 104, and in electrical contact with the first layer 102. The first and second contacts 108 and 110 are oriented at an angle to each other and the first contact has a first end 112 in proximity with the second contact. The first end 112 is sufficiently spaced apart from the second contact 110 such that when current is supplied to the first layer 102 through the contacts 108 and 110, current contributions from the first end of the first contact and the second contact in an area generally between the first end and the second contact cause a current density in the area that is approximately equal to a current density elsewhere along the first and second contacts.

In general, the first layer 102 may comprise a semiconductor material having low mobility of charge carriers, and consequently current supplied to the first layer through the contacts 108 and 110 may not spread out sufficiently to produce a uniform current distribution across the first layer resulting in areas of higher current density. Such areas of higher current density may cause increased light generation or bright spots in these areas and may also result in localized heating of the semiconductor structure 100 in the area. Semiconductor light emitting structures exhibiting such localized heating and bright spots due to higher current density are said to suffer from "current crowding".

In the embodiment shown in FIG. 1 and FIG. 2, the structure 100 is grown on a generally rectangular substrate 114 and the contacts 108 and 110 are located along respective adjacent peripheral edges 116 and 118 of the structure 100. The second contact 110 includes a first end 120, which is located in proximity with the first end 112 of the first contact 108, and the first and second ends are both proximate a first corner 121 of the structure 100. In this embodiment the first and second contacts 108 and 110 are generally oriented at an angle of about 90° to each other.

The structure 100 further includes third and fourth electrical contacts 122 and 124, located along respective adjacent peripheral edges 126 and 128 of the structure 100, and having proximate first ends 130 and 132 adjacent a second corner 131 of the structure 100.

The first contact 108 includes a second end 140, and the third electrical contact 122 includes a second end 142. The second ends 140 and 142 are located proximate a third corner 138 of the structure 100. The second contact 110 includes a second end 144, and the fourth electrical contact 124 includes a second end 146. The second ends 144 and 146 are located proximate a fourth corner 148 of the structure 100.

The structure 100 also includes a plurality of via contacts 133. Each via contact includes an aperture 134 extending through the second layer 106 and the active layer 104, and an electrically conductive material 136 extending through the aperture 134, and in contact with the first layer 102.

The elongate electrical contacts 108, 110, 122 and 124, and the via contacts 133 may be interconnected (not shown) to provide electrical connection to the first layer 102, such that current supplied to the semiconductor light emitting apparatus spreads out laterally across the first layer 102.

In one embodiment the first layer 102 includes an n-type semiconductor material and the second layer 106 includes a p-type semiconductor material. Materials used for n-type and p-type layers in semiconductor in light emitting devices generally have low mobility charge carriers, which results in relatively high resistivity of the first layer 102, thus making these structures especially prone to current crowding effects. The electrical contacts 108, 110, 122 and 124 generally include low resistivity metals, resulting in good lateral spreading of current in electrical contacts.

Figure 3:
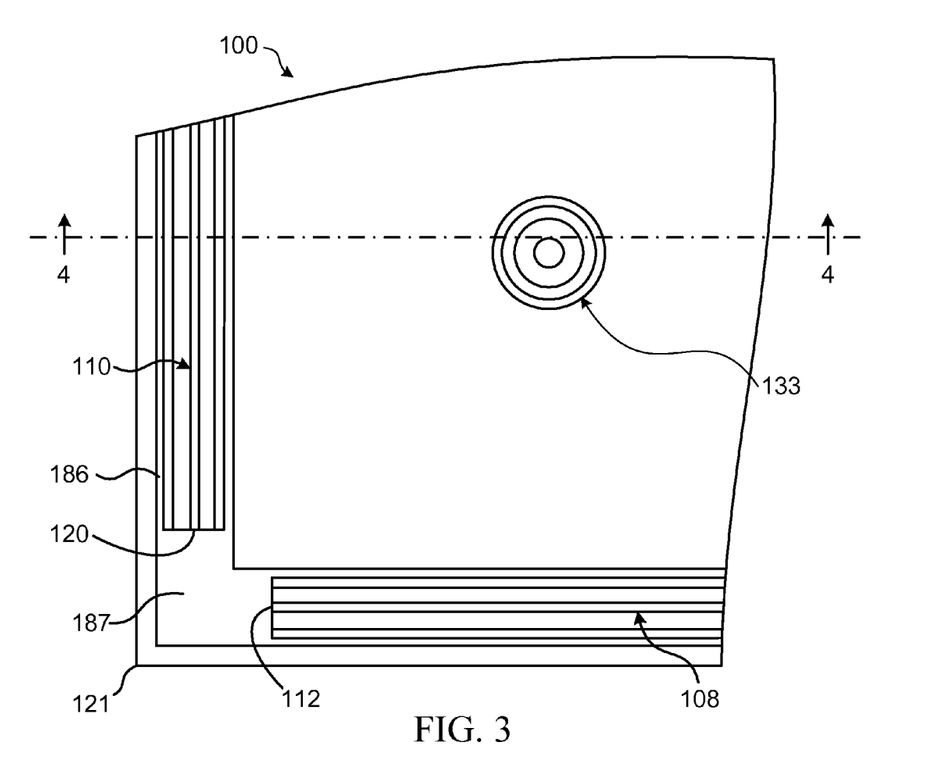
FIG. 3 is a detailed schematic plan view of a portion of the semiconductor structure shown in FIG. 1.
Figure 4:
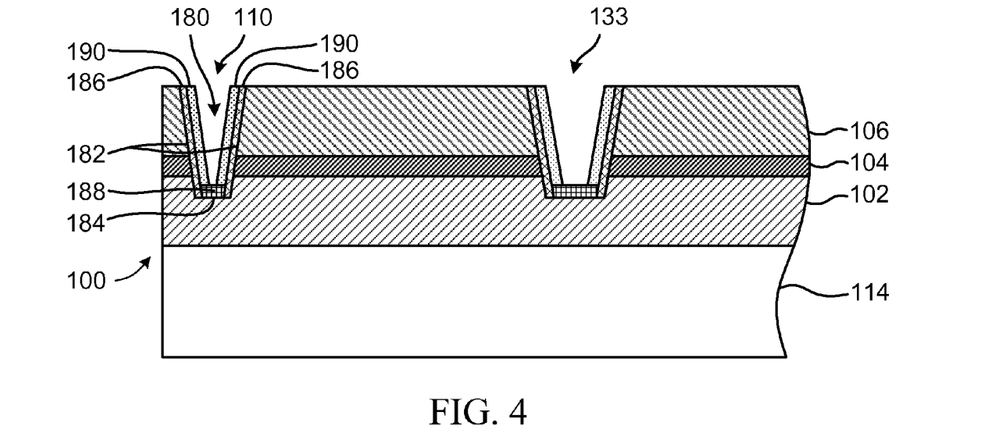
FIG. 4 is a schematic cross sectional view of the portion of the semiconductor structure shown in FIG. 3.

A portion of the semiconductor structure 100 is shown in greater detail in FIG. 3 and FIG. 4. Referring to FIG. 4, the contact 110 includes a channel 180, having sidewalls 182 extending through the second layer 106 and the active layer 104, and a bottom wall 184 located in the first layer 102.

The contact 110 includes a dielectric material layer 186 along the sidewalls 182, and further includes a first conductive material layer 188 on the bottom wall of the channel 180, which is in electrical contact with the first layer 102. Referring to FIG. 3, the dielectric layer 186 may also include a portion 187 between the ends 112 and 120, of the contacts 108 and 110. The dielectric layer portion 187 is operable to insulate and fill a space between the ends 112 and 120 of the contacts 108 and 112.

Referring back to FIG. 4, the contact 110 also includes a second conductive material layer 190 along the sidewalls 182. The first conductive material layer 188 is in electrical contact with the second conductive material layer 190. The dielectric material layer 186 provides insulation between the second layer 106 and the active layer 104, and the conductive layers 188 and 190.

In one embodiment the first and second conductive material layers 188 and 190 include titanium and/or gold. Titanium provides good adhesion and good ohmic contact with n-type semiconductor materials and gold is used to provide mounting surfaces for mounting the device to a carrier (not shown). In other embodiments the conductive material layers 188 and 190 may include aluminum and/or gold, for example.

In the embodiment shown in FIG. 4, the channel 180 includes sidewalls 182 having a mesa shape (i.e. the channel tapers inwardly as it extends through the second layer 106 and the active layer 104).

The elongate contacts 108, 122, and 124 all have a similar structure to the contact 110. The via contacts 133 generally include a similar mesa sidewall structure to the second contact 110, except that the via contacts have a generally circular shape, as shown in FIG. 3 at 133.

The elongate contacts 108, 110, 122, and 124 and the via contacts 133 generally provide a plurality of contacts distributed laterally over the first layer 102, that when interconnected provide connection to the first layer 102 such that current supplied thereto spreads out laterally across the first layer and through the active layer 104, where light is generated.

Figure 5:
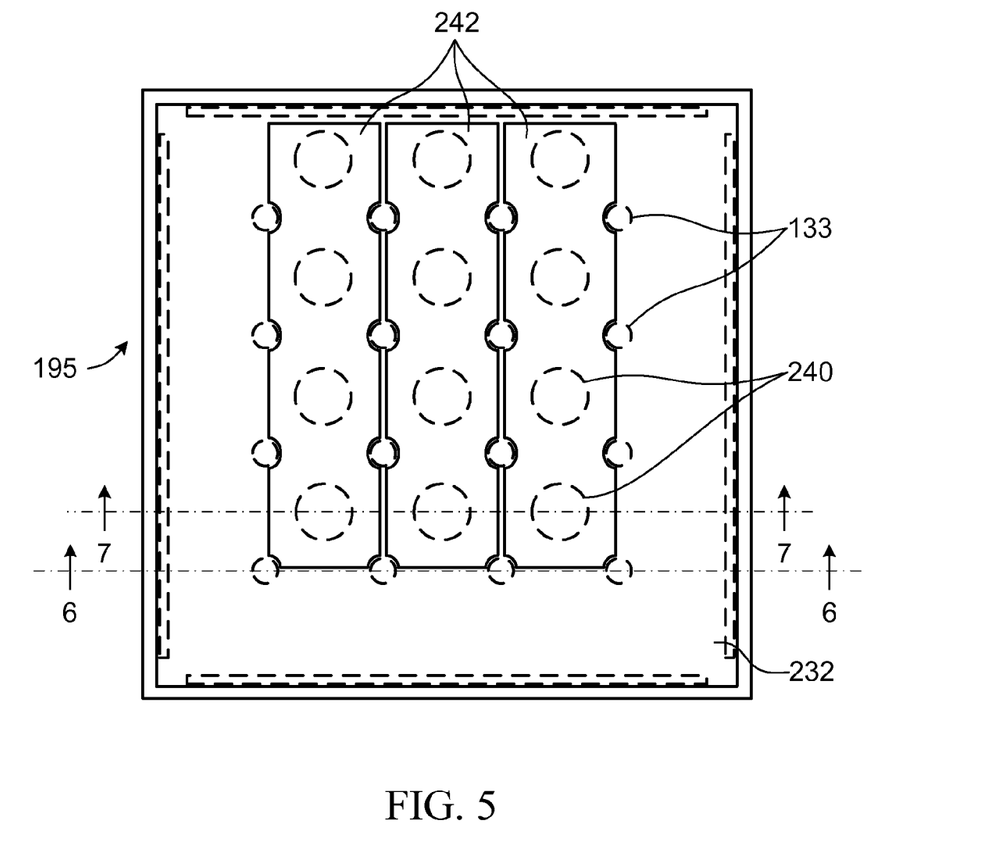
FIG. 5 is a schematic plan view of an interconnected semiconductor structure in accordance with another embodiment of the invention.
Figure 6:
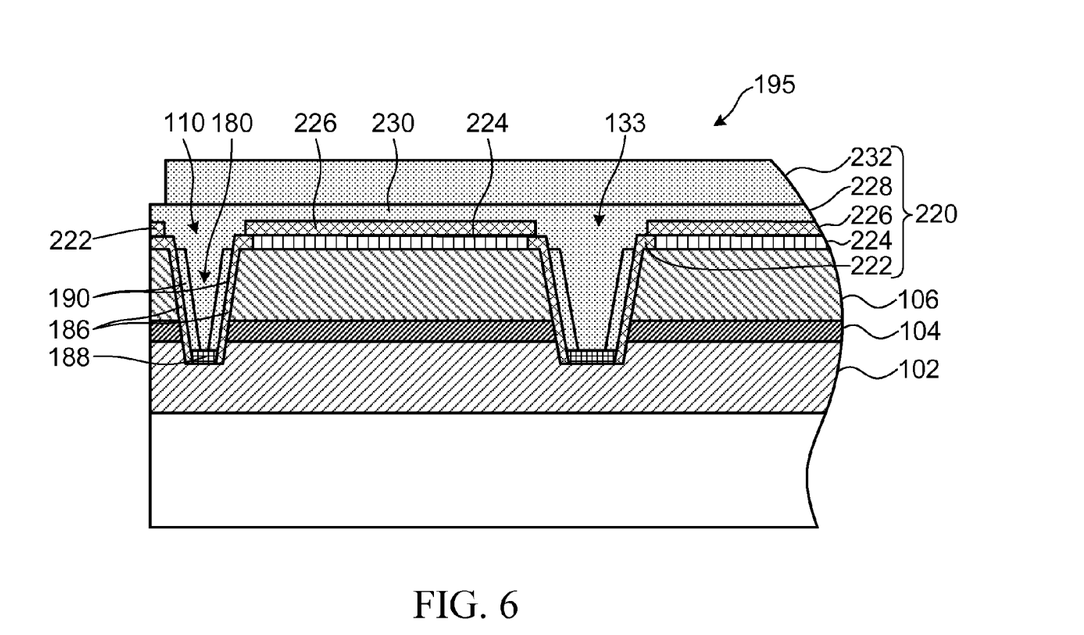
FIG. 6 is a first schematic cross sectional view of a portion of the interconnected semiconductor structure shown in FIG. 5.
Figure 7:
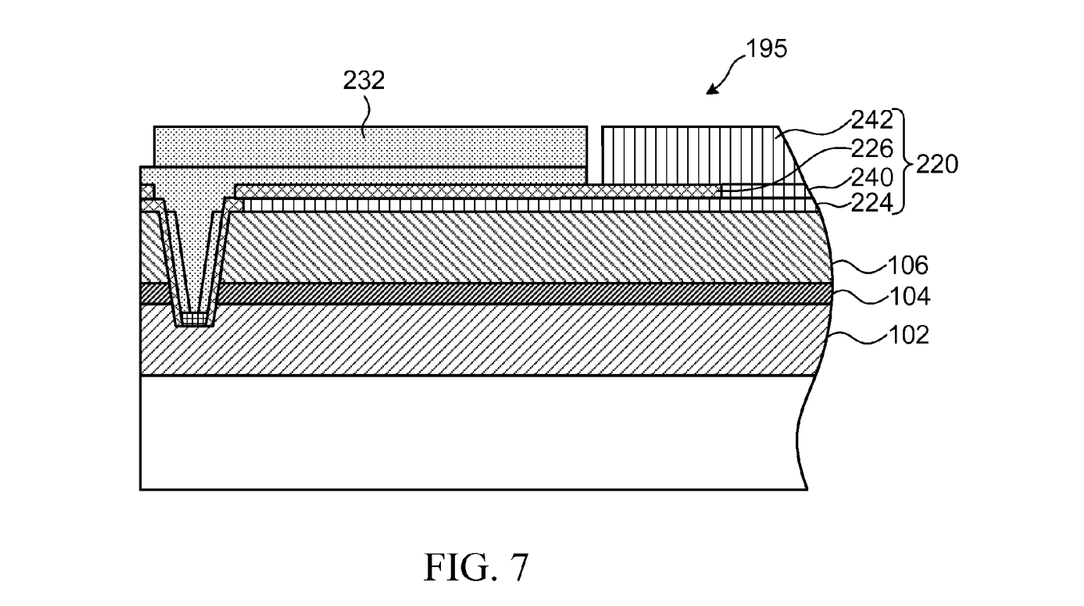
FIG. 7 is a second schematic cross sectional view of a portion of the interconnected semiconductor structure shown in FIG. 5.

An interconnected semiconductor structure in accordance with another embodiment of the invention is shown in FIGS. 5-7 at 195. Connections to the first layer 102 are shown in cross sectional detail in FIG. 6. Referring to FIG. 6, the interconnected semiconductor structure 195 includes the semiconductor structure 100 shown in FIGS. 3 and 4 and further includes a plurality of connection layers 220 overlying the second layer 106. The connection layers 220 include a first dielectric layer 222 on the second layer 106. The first dielectric layer 222 is contiguous with the dielectric layer 186 on the sidewalls of the contacts 110 and 133. The connection layers 220 further include a first electrode 224 overlying the second layer 106 in a region between the contacts 110 and 133. The first electrode 224 provides electrical connection to the second layer 106, and may also function as a light reflector as will be described later herein.

The connection layers 220 also include a second dielectric layer 226 overlying the electrode 224. The connection layers 220 include a second electrode 228, which is in electrical contact with the first and second conductive material layers 188 and 190. The second electrode 228 includes a portion 230 interconnecting between the elongate contact 110 and the via contact 133. The second dielectric layer 226 insulates the first electrode 224 from the second electrode 228.

In the embodiment shown the connection layers 220 include a first conductive mounting layer 232 over the second electrode 228. The first mounting layer 232 facilitates mounting the structure 195 on a carrier (not shown) such as a flip-chip carrier for example, while simultaneously providing a first polarity electrical connection thereto for receiving an electrical current.

The connection layers 220 also provide interconnection between the other elongate contacts 108, 122, and 124 and the other via contacts 133, such that all the contacts to the first layer 102 are interconnected by the connection layers.

Connections to the second layer 106 are shown in cross sectional detail in FIG. 7. Referring to FIG. 7, the connection layers 220 further include a plurality of circular conductive areas 240 (as best shown in FIG. 5) extending through the second dielectric layer 226 and in electrical contact with the first electrode 224. The connection layers 220 further include a second conductive mounting layer 242 in electrical contact with the circular conductive areas 240. The second mounting layer 242 facilitates mounting the structure 195 on a carrier (not shown) such as a flip-chip carrier for example, while simultaneously providing a second polarity electrical connection thereto for receiving electrical current.

The outermost connection layers are shown in plan view in FIG. 5. Referring to FIG. 5 the second mounting layer 242 includes three insulated regions, each region being in electrical contact with the second layer 106 through the underlying circular conductive areas 240 and the first electrode 224 (not shown in FIG. 5). The second mounting layer 242 is surrounded by the first mounting layer 232 which is in electrical contact with the first layer 102 through the via contacts 133 and the elongate contacts 108, 110, 122, and 124.

When a forward bias voltage is applied across the first and second layers 102 and 106 a forward bias current flows through the second layer 106, the active layer 104, and the first layer 102, and photons are generated in the active layer. The current flows through the elongate contacts 108, 110, 122 and 124 and the via contacts 133 such that current laterally spreads across the first layer 102, thus uniformly generating light in the active layer 104. The spacing between the ends of the elongate contacts reduces current crowding in the corners 121, 138, 131, and 148, of the structure 195, which would otherwise cause hot spots in the corners. For embodiments where the first layer is an n-type material, and the second layer is a p-type material, forward bias occurs when the p-type layer 106 is made more positive than the n-type layer 102.

The photons generated in the active layer 104 are incident in all directions, and photons incident on the first electrode 224 are reflected back through the second layer 106, the active layer 104, and the first layer 102, through the substrate 114, and are emitted as light therefrom. Other photons from the active layer 104 that are directly incident on the first layer 102 pass through the first layer, through the substrate 114, and are emitted as light therefrom. Advantageously, the spaced apart ends of the elongate contacts 108, 110, 122 and 124 reduce current crowding in corners of the semiconductor light emitting apparatus, thus reducing bright spots and providing a more uniform light output from the apparatus.

Figure 8:
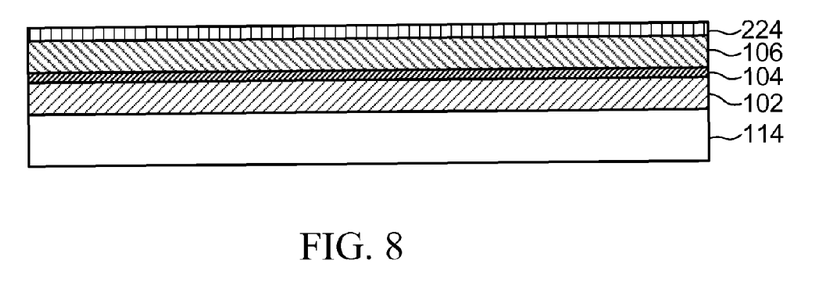
FIGS. 8-13 are a series of schematic cross-sectional views illustrating processing of an interconnected semiconductor structure in accordance with an embodiment of the invention.

A process for preparing the semiconductor structure 100 in accordance with one embodiment of the invention is described with reference to FIGS. 8-12. Referring to FIG. 8, the process starts with epitaxial deposition of the first layer 102, the active layer 104, and the second layer 106 on the substrate 114. The first layer 102 may include one or more n-type layers of varying composition and dopant concentration, for example. The active layer 104 may include, for example, a set of quantum well layers separated by a set of barrier layers. The second layer 106 may include a p-type layer, including one or more layers of varying composition and dopant concentration, for example.

The process continues with the deposition of the first electrode 224. In embodiments where the second layer 106 includes a p-type material, the first electrode 224 may also function as a light reflector for reflecting light generated in the active layer 104 back through the active layer and the first layer 102, to exit the semiconductor light emitting device through the substrate 114, or if the substrate is removed, through the first layer. In some embodiments (not shown), the first electrode 224 may include silver and one or more ohmic contact layers may be deposited under the conductive material layer, and one or more guard metal layers may be deposited over the conductive material layer. The guard metal layer functions to prevent silver from migrating to other parts of the structure 100.

Figure 9:
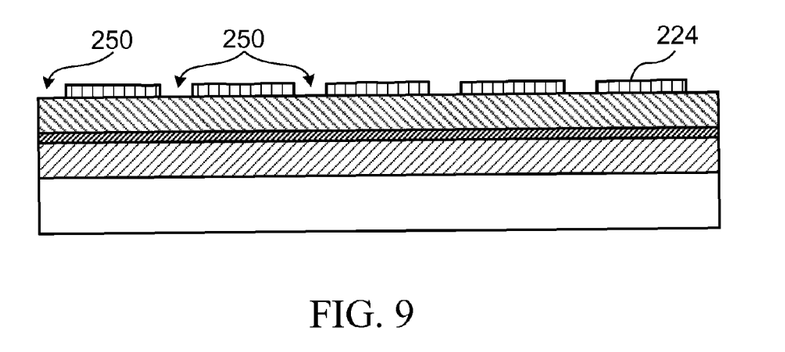

Referring to FIG. 9, the first electrode 224 is then patterned and etched to form a plurality of openings 250 in the conductive material layer. Patterning may involve applying a resist material (not shown) over the first electrode 224 and then selectively patterning the resist material to form a pattern corresponding to the openings 250, for example. The resist layer is then developed and the structure 100 is etched to form the openings 250.

Figure 10:
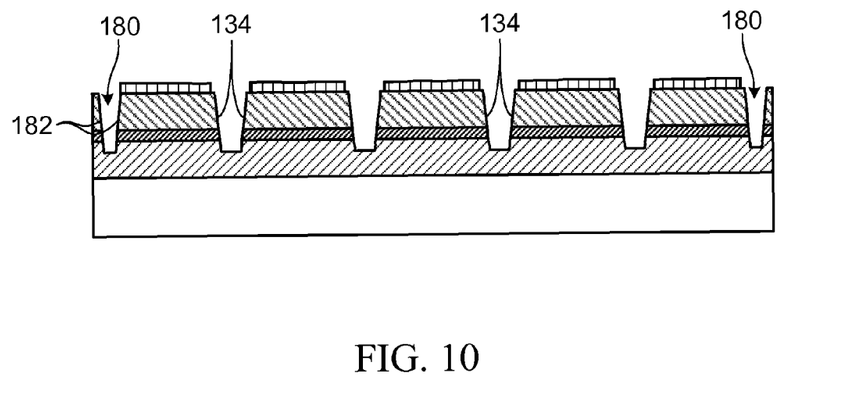

Referring to FIG. 10, the process continues with the formation of the channels 180 and the apertures 134, which may be formed by applying a resist layer over the first electrode 224, patterning a resist layer, and then etching the channels and apertures, as described above. Advantageously, the etch processes may be selected to produce mesa shaped sidewalls 182, which have sufficient taper to ensure uniform deposition of subsequent layers in the channel 180.

Referring back to FIG. 3, the channels 180 are formed such that that the ends 112 and 120 of adjacent channels are spaced apart in proximity with the corner 121 (and other corners) of the structure 100.

Referring back to FIG. 2, in general, current supplied to the structure 100 through the second contact 110 spreads out from the contact as shown by current flow lines 154. Referring to FIG. 1, a current contribution from the second contact 110 that flows through a first unit area 150 of the first layer 102 located proximate a central location along the second contact, causes a first current density through the first unit area. A current contribution from the first end 112 of the first contact 108 and from the first end 120 of the second contact 110 that flows through a second unit area 152 of the first layer 102 located between the first end 112 and the second end 120, causes a second current density through the second unit area. The first unit area 150 receives current from only the first contact 110, while the second unit area 152 receives current from both the first and second contacts 108 and 110. Accordingly, by spacing apart the ends 112 and 120 of the first and second contacts 108 and 110 respectively, the current contributions from each of the ends 112 and 120 that flow through the area 152 are reduced, thus reducing the overall current density flowing through the second unit area 152. The spacing between the ends 112 and 120 is selected to cause the current density through the area 152 to be approximately equal to the current density elsewhere along the contacts 108 and 110 (for example through the area 150). Advantageously, reducing current crowding at the corner 121 results in increased uniformity of temperature and light generation laterally across the structure 100, thus increasing the reliability of the semiconductor light emitting apparatus. Current crowding may lead to localized overheating due to higher current density in the first layer 102 where pairs of electrical contacts have proximate or joined regions. Furthermore, non-uniform current density across the first layer 102 also may cause non-uniform light generation in the active layer 104. Advantageously, spacing apart adjacent ends of the elongate electrical contacts 108, 110, 122, and 124 reduces current crowding at the corners 121, 131, 138, and 148 of the structure 100.

Alternatively in another embodiment, the channels 180 and the aperture 134 may be formed by selectively growing the layers 102, 104, and 106 on the substrate 114, such that these layers are not grown where there is desired to be a channel or aperture.

Figure 11:
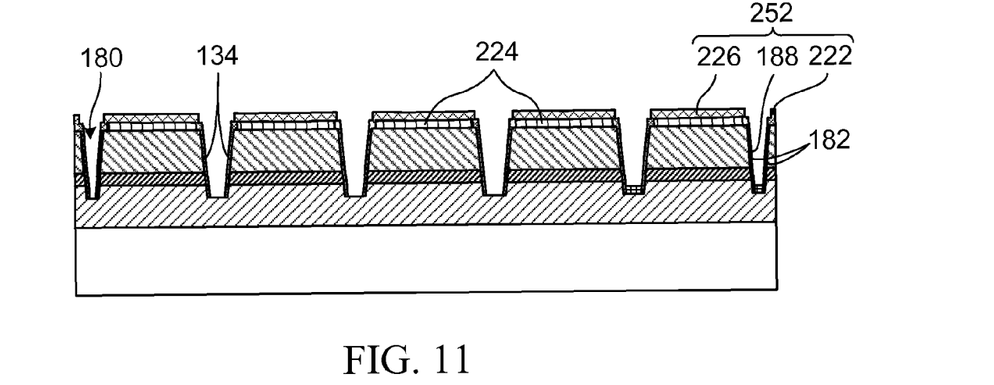

Referring to FIG. 11, the process continues with the deposition of a dielectric layer 252 over the structure. The dielectric layer 252 includes the dielectric layer 186 along the sidewalls 182 of the channels 180 and apertures 134, and the dielectric layer 226 over the first electrode 224. The dielectric layer 252 may include aluminum oxide or silicon nitride, for example.

Referring back to FIG. 3, the dielectric layer 252 further includes the portion 187, which is deposited in the corners 121 (and the corners 131, 138, and 148) of the structure 100.

Figure 12:
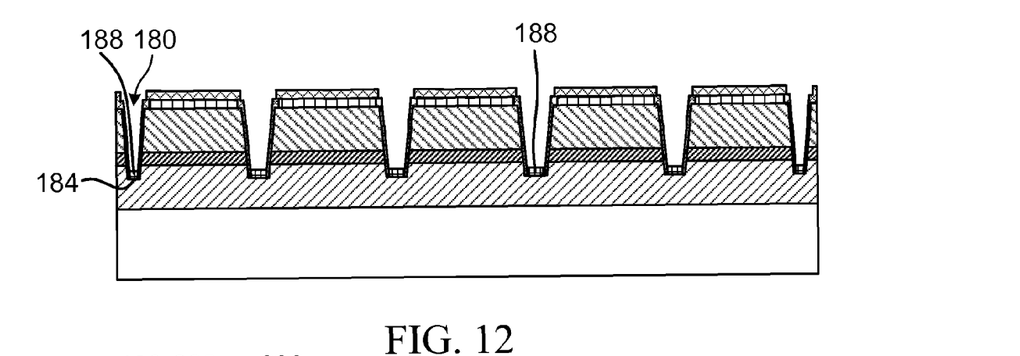

Referring to FIG. 12, the process continues with deposition of the first conductive material layer 188 on the bottom wall 184 of the channel 180 and the bottom wall or the apertures 134. The first conductive material layer 188 may include gold, titanium, or aluminum, for example.

Figure 13:
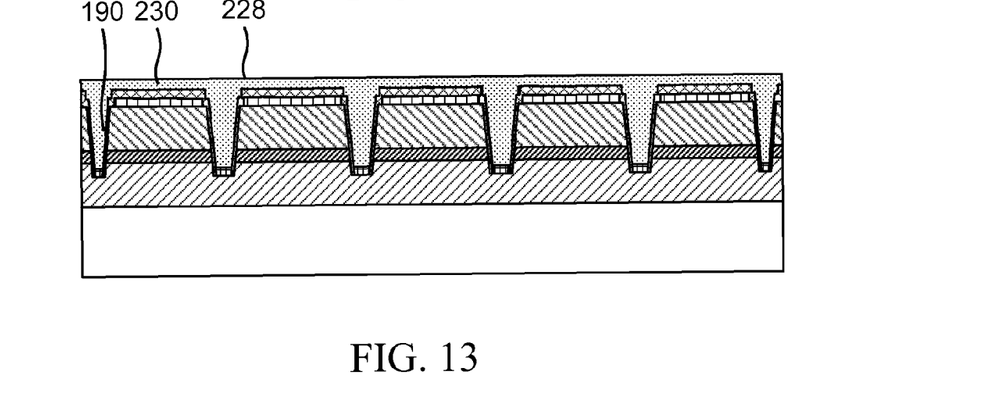

Referring to FIG. 13, the process continues with deposition of the second electrode 228, which includes conductive material portions 190, in electrical contact with the first conductive material layer 188 and conductive material portions 230 interconnecting between the channels 180 and the apertures 134. Referring back to FIG. 3, the dielectric portion 187 in the corner 121 causes the ends 112 and 120 of the contacts 108 and 110 to be spaced apart, thus reducing current crowding in the corner 121 when the structure is operated to produce light. Similarly, other proximate ends of the first, second, third and fourth contacts 108, 110, 122, and 124 are similarly spaced apart in the corners 131, 138 and 148 respectively.

In the above embodiment, the conductive material layer 188 is deposited on the bottom wall 184 of the channel 180, and then patterned and etched to cause the ends of the elongated contacts 108, 110, 122, and 124 to be spaced apart. Alternatively, in other embodiments, dielectric material may be deposited in the corner areas such that when conductive material layer 188 is deposited, the ends of the elongate contacts are insulated from each other by the dielectric layer.

Figure 14:
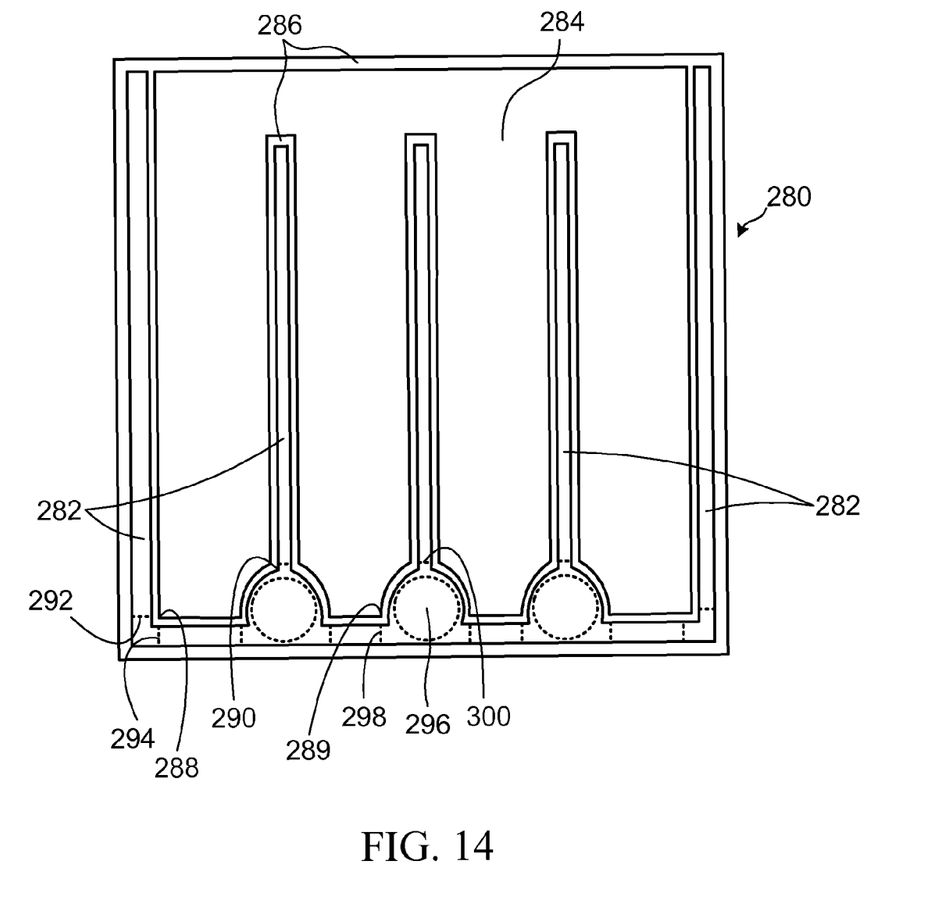
FIG. 14 is a schematic plan view of an alternate embodiment of a semiconductor structure.

An alternative embodiment of a semiconductor structure for use in a semiconductor light emitting apparatus is shown in FIG. 14 at 280. Referring to FIG. 14, the semiconductor structure 280 includes a plurality of finger shaped electrical contacts 282. The finger shaped electrical contacts 282 are in electrical connection with an underlying n-type semiconductor layer (not shown). The semiconductor structure 280 further includes a large area electrical contact 284, which is in electrical connection with a p-type semiconductor layer (not shown). The finger shaped electrical contacts 282 and the area electrical contact 284 are insulated from one another by a dielectric layer 286.

The semiconductor structure 280 includes a plurality of corners 288 and 289 and further includes a plurality of generally "T" shaped intersections 290 between the finger shaped electrical contacts 282. As described above, the connection between the finger shaped electrical contacts 282 and the underlying n-type semiconductor layer may result in current crowding at the corners 288, 289 and the intersections 290 between portions of the finger shaped contacts. Accordingly, in the embodiment shown the finger shaped electrical contacts 282 have ends that are sufficiently spaced apart in the region where the contacts are in electrical connection with the underling n-type semiconductor layer to reduce current crowding in the n-type layer. For example, at the corners 288, the electrical contacts 282 have spaced apart underlying ends 292 and 294 (shown in broken lines). The electrical contacts 282 further include underlying circular pad contacts 296 (shown in broken lines) in electrical connection with the n-type layer, and the finger shaped contacts 282 include underlying ends 298 that are spaced apart from the circular pad contact. At the "T" intersections 290, the finger shaped contacts 282 include underlying ends 300 which are spaced apart from the circular pads 296.

In general the contacts and methods of forming contacts described herein may be applied to other generally intersecting contact geometries used in LEDs. For example, contacts that are angled to each other at other than right angles and have intersecting ends may also benefit from application of the methods described above to reduce current crowding.

While specific embodiments of the invention have been described and illustrated, such embodiments should be considered illustrative of the invention only and not as limiting the invention as construed in accordance with the accompanying claims.

What is claimed is:

1. A process for forming electrical contacts for a semiconductor light emitting apparatus, the light emitting apparatus having a first layer of first conductivity type, an active layer for generating light overlying the first layer, and a second layer of second conductivity type overlying the active layer, the process comprising:

forming at least a first elongate electrical contact and a second elongate electrical contact through the second layer and the active layer to provide electrical connection to the first layer, said first and second contacts being oriented at an angle to each other, said first contact having a first end in proximity with said second contact, said first end being sufficiently spaced apart from said second contact such that when current is supplied to the first layer through said contacts, current contributions from said first end of said first contact and said second contact in an area generally between said first end and said second contact cause a current density in said area that is approximately equal to a current density elsewhere along said first and second contacts;

wherein no electrical contact is located in the area between said first end and said second contact.

2. The process of claim 1 wherein said forming comprises forming said first and second contacts such that said first end of said first contact is proximate a first end of said second contact.

3. The process of claim 2 wherein said semiconductor light emitting apparatus comprises a generally rectangular semiconductor structure and wherein said forming comprises forming said contacts along adjacent peripheral edges of said semiconductor structure such that said first end of said first contact and said first end of said second contact are proximate a first corner of said semiconductor structure.

4. The process of claim 3 wherein said forming comprises forming electrical contacts along each of said peripheral edges of said rectangular semiconductor structure such that adjacent pairs of said contacts have spaced apart ends proximate respective corners of said generally rectangular semiconductor structure such that when current is supplied to the first layer through said contacts, current contributions from said respective spaced apart ends in an area generally between said spaced apart ends cause a current density in said area that is approximately equal to a current density elsewhere along said contacts.

5. The process of claim 4 further comprising forming at least one aperture through the second layer and the active layer and forming an electrical via contact to the first layer through said aperture, said aperture being spaced inwardly from said peripheral edges of said semiconductor structure.

6. The process of claim 5 further comprising interconnecting said electrical via contact and said at least said first and said second contacts to form a first electrode for supplying current to the first layer.

7. The process of claim 1, wherein said forming comprises:

forming a channel having sidewalls and a bottom wall, said sidewalls extending through the second layer and the active layer, said bottom wall comprising a portion of said first layer;

insulating said sidewalls to prevent electrical contact to the second layer and the active layer by said first and second electrical contacts; and depositing an electrically conductive material in said channel in electrical contact with the first layer such that said first end of said first contact is spaced apart from said second contact.

8. The process of claim 7 wherein said depositing comprises patterning said electrically conductive material to remove conductive material from at least said first end of said first contact to cause said first end of said first contact to be spaced apart from said second contact.

9. The process of claim 7 wherein said insulating comprises depositing a dielectric material proximate said first end of said first contact, said dielectric material being operable to insulate said first end from said second contact when depositing said electrically conductive material in said channel.

10. The process of claim 1 further comprising interconnecting said at least said first and said second contacts.

11. The process of claim 10 wherein said interconnecting comprises forming an interconnecting layer between said elongate electrical contacts, said interconnecting layer overlying at least a portion of the second layer and being insulated therefrom.

12. The process of claim 1 wherein said forming comprises forming said electrical contacts by removing portions of the second layer and the active layer.

13. A semiconductor structure for use in a semiconductor light emitting apparatus, the structure comprising:
   a first layer having a first conductivity type;
   an active layer for generating light, said active layer overlying said first layer;
   a second layer having a second conductivity type, said second layer overlying said active layer;
   at least a first and a second elongate electrical contact extending through said second layer and said active layer and in electrical contact with said first layer, said first and second contacts being oriented at an angle to each other, said first contact having a first end proximate said second contact, said first end being sufficiently spaced apart from said second contact such that when current is supplied to the first layer through said contacts, current contributions from said first end of said first contact and said second contact in an area generally between said first end and said second contact cause a current density in said area that is approximately equal to a current density elsewhere along said first and second contacts;
   wherein no electrical contact is located in the area between said first end and said second contact.

14. The structure of claim 13 wherein said first end of said first contact is proximate a first end of said second contact.

15. The structure of claim 14 wherein said semiconductor light emitting structure comprises a generally rectangular semiconductor structure and wherein said first contact extends along a first peripheral edge of said semiconductor structure and said second contact extends along a second adjacent peripheral edge of said semiconductor structure such that said first end of said first contact and said first end of said second contact are proximate a first corner of said semiconductor structure.

16. The structure of claim 15 further comprising a third elongate electrical contact extending along a third peripheral edge of said semiconductor structure and a fourth elongate electrical contact extending along a fourth peripheral edge of said semiconductor structure such that adjacent pairs of said first, second, third, and fourth contacts have spaced apart ends proximate respective corners of said generally rectangular semiconductor structure such that when current is supplied to the first layer through said contacts, current contributions from said respective spaced apart ends in an area generally between said spaced apart ends cause a current density in said area that is approximately equal to a current density elsewhere along said contacts.

17. The structure of claim 16 further comprising:
   at least one aperture extending through said second layer and said active layer, said aperture being spaced inwardly from said peripheral edges of said semiconductor structure;
   an electrical via contact extending through said aperture and in electrical contact with said first layer.

18. The structure of claim 17 further comprising an interconnect between said electrical via contact and said at least said first and said second contacts, said interconnect being operable to facilitate supplying current to said first layer.

19. The structure of claim 13, wherein each elongate electrical contact comprises:
   a channel having sidewalls and a bottom wall, said sidewalls extending through said second layer and said active layer, said bottom wall comprising a portion of said first layer;
   an electrically conductive material in said channel and in electrical contact with said first layer; and
   a dielectric material between said electrically conductive material and said sidewalls, said dielectric material being operable to prevent electrical contact to said second layer and said active layer by said first and second contacts.

20. The structure of claim 13 further comprising an interconnect between said at least said first and said second contacts, said interconnect being operable to facilitate supplying current to said first layer.

21. The structure of claim 20 wherein said interconnect comprises interconnect portions overlying at least a first portion of said second layer, said interconnect portions being insulated from the second layer.

22. The structure of claim 13 wherein said first layer comprises an n-type semiconductor material and said second layer comprises a p-type semiconductor material.

23. A semiconductor light emitting apparatus comprising the semiconductor structure of claim 13 and further comprising a first electrode in electrical contact with said at least said first and said second electrical contacts and a second electrode in electrical contact with said second layer, whereby light is generated in said active layer when a voltage is applied between said first electrode and said second electrode such that a forward bias current flows through said active layer.

* * * * *